(12) United States Patent
Hardin et al.

(10) Patent No.: US 9,698,283 B2
(45) Date of Patent: Jul. 4, 2017

(54) CORE-SHELL NICKEL ALLOY COMPOSITE PARTICLE METALLIZATION LAYERS FOR SILICON SOLAR CELLS

(71) Applicant: Plant PV, Oakland, CA (US)

(72) Inventors: Brian E. Hardin, Berkeley, CA (US); Stephen T. Connor, San Francisco, CA (US); James Randy Groves, Sunnyvale, CA (US); Craig H. Peters, Oakland, CA (US)

(73) Assignee: PLANT PV, Inc., Alameda, CA (US)

( * ) Notice: Subject to any disclaimer, the term of this patent is extended or adjusted under 35 U.S.C. 154(b) by 334 days.

(21) Appl. No.: 14/311,239

(22) Filed: Jun. 20, 2014

(65) Prior Publication Data

US 2014/0374669 A1    Dec. 25, 2014

Related U.S. Application Data

(60) Provisional application No. 62/011,496, filed on Jun. 12, 2014, provisional application No. 61/986,025, filed on Apr. 29, 2014, provisional application No. 61/837,575, filed on Jun. 20, 2013, provisional application No. 61/881,394, filed on Sep. 23, 2013, provisional application No. 61/986,020, filed on Apr. 29, 2014.

(51) Int. Cl.
| | |
|---|---|
| *H01L 31/00* | (2006.01) |
| *H01B 1/22* | (2006.01) |
| *H01L 31/0224* | (2006.01) |
| *H01L 31/068* | (2012.01) |

(52) U.S. Cl.
CPC ....... *H01L 31/022425* (2013.01); *H01B 1/22* (2013.01); *H01L 31/068* (2013.01); *Y02E 10/547* (2013.01)

(58) Field of Classification Search
CPC ........ H01B 1/22; H01L 31/068; Y02E 10/547
USPC ......................................................... 252/500
See application file for complete search history.

(56) References Cited

U.S. PATENT DOCUMENTS

| | | | |
|---|---|---|---|
| 2,580,773 | A | 1/1952 | Heiman |
| 2,662,831 | A | 12/1953 | Culverhouse, Jr. |
| 2,852,366 | A | 9/1958 | Jenkins |
| 3,489,657 | A | 1/1970 | Brenan |
| 3,744,121 | A | 7/1973 | Nagano et al. |
| 3,909,209 | A | 9/1975 | Kruper et al. |

(Continued)

FOREIGN PATENT DOCUMENTS

| | | |
|---|---|---|
| DE | 102011104396 A1 | 12/2012 |
| EP | 1732137 B1 | 10/2011 |

(Continued)

OTHER PUBLICATIONS

International Search Report and Written Opinion of the International Searching Authority for PCT/US2014/043521, dated Dec. 23, 2014.

(Continued)

*Primary Examiner* — Harold Pyon
*Assistant Examiner* — Danny N Kang
(74) *Attorney, Agent, or Firm* — R'Sue Popowich Caron

(57) ABSTRACT

Materials and methods for fabrication of rear tabbing, front busbar, and fine grid line layers for silicon based photovoltaic cells are disclosed. Materials include conductive metallization pastes that contain core-shell nickel based particles.

29 Claims, 10 Drawing Sheets

(56) References Cited

U.S. PATENT DOCUMENTS

| | | | |
|---|---|---|---|
| 3,930,093 | A | 12/1975 | Short |
| 3,949,118 | A | 4/1976 | Nagano et al. |
| 4,001,146 | A | 1/1977 | Horowitz |
| 4,045,245 | A | 8/1977 | Coleman et al. |
| 4,122,232 | A | 10/1978 | Kuo |
| 4,130,854 | A | 12/1978 | Hertz |
| 4,137,361 | A | 1/1979 | Deffeyes |
| 4,347,165 | A | 8/1982 | Matheson |
| 4,397,812 | A | 8/1983 | Mallory |
| 4,485,153 | A | 11/1984 | Janikowski |
| 4,492,812 | A | 1/1985 | Lindmayer |
| 4,635,701 | A | 1/1987 | Sare |
| 4,800,065 | A | 1/1989 | Christodoulou |
| 4,833,040 | A | 5/1989 | Fishman |
| 4,873,148 | A | 10/1989 | Kemp |
| 5,118,362 | A | 6/1992 | Angelo et al. |
| 5,162,062 | A | 11/1992 | Carroll et al. |
| 5,178,685 | A | 1/1993 | Borenstein et al. |
| 5,279,682 | A | 1/1994 | Wald et al. |
| 5,320,684 | A | 6/1994 | Amick |
| 5,645,765 | A | 7/1997 | Asada et al. |
| 5,714,238 | A | 2/1998 | Komagata |
| 5,840,432 | A | 11/1998 | Hirai et al. |
| 6,059,952 | A | 5/2000 | Kang |
| 6,156,237 | A | 12/2000 | Kubota et al. |
| 6,180,869 | B1 | 1/2001 | Meier et al. |
| 6,262,359 | B1 | 7/2001 | Meier et al. |
| 6,372,158 | B1 | 4/2002 | Hashimoto et al. |
| 6,632,730 | B1 | 10/2003 | Meier et al. |
| 6,710,239 | B2 | 3/2004 | Tanaka |
| 6,770,369 | B1 | 8/2004 | Oyamada |
| 7,384,447 | B2 | 6/2008 | Kodas |
| 7,470,416 | B2 | 12/2008 | Ishida |
| 8,093,491 | B2 | 1/2012 | Sridharan et al. |
| 8,597,397 | B2 | 12/2013 | Kunze |
| 8,610,289 | B2 | 12/2013 | Wildpanner et al. |
| 8,696,946 | B2 | 4/2014 | Matsumoto |
| 8,697,476 | B2 | 4/2014 | Borland |
| 8,748,327 | B2 | 6/2014 | Park et al. |
| 8,884,277 | B2 | 11/2014 | Neidert et al. |
| 9,275,772 | B2 | 3/2016 | Pham et al. |
| 2004/0155227 | A1 | 8/2004 | Bechtloff |
| 2006/0022173 | A1 | 2/2006 | Yamakawa et al. |
| 2006/0042681 | A1 | 3/2006 | Korman |
| 2006/0289055 | A1 | 12/2006 | Sridharan et al. |
| 2007/0056403 | A1* | 3/2007 | Kubota ............... B22F 1/0059 75/372 |
| 2008/0143785 | A1 | 6/2008 | Houjou |
| 2008/0230119 | A1 | 9/2008 | Akimoto |
| 2009/0211626 | A1 | 8/2009 | Akimoto |
| 2010/0120191 | A1 | 5/2010 | Borden |
| 2010/0163101 | A1 | 7/2010 | Kumar |
| 2010/0227433 | A1 | 9/2010 | Konno |
| 2010/0243048 | A1 | 9/2010 | Laudisio et al. |
| 2010/0269893 | A1 | 10/2010 | Prince |
| 2011/0192457 | A1 | 8/2011 | Nakayama et al. |
| 2011/0197960 | A1 | 8/2011 | Pham et al. |
| 2011/0223713 | A1 | 9/2011 | Akimoto |
| 2011/0303898 | A1 | 12/2011 | Tian |
| 2011/0315217 | A1 | 12/2011 | Gee |
| 2012/0082948 | A1 | 4/2012 | Huh |
| 2012/0085401 | A1 | 4/2012 | Borland et al. |
| 2012/0279563 | A1 | 11/2012 | Meier et al. |
| 2013/0098431 | A1 | 4/2013 | Chen et al. |
| 2013/0248777 | A1 | 9/2013 | Sgriccia |
| 2013/0256606 | A1* | 10/2013 | Matsumoto ............ H01R 13/03 252/513 |
| 2013/0270489 | A1 | 10/2013 | Wang et al. |
| 2013/0277624 | A1 | 10/2013 | Yang |
| 2013/0284250 | A1 | 10/2013 | Hang et al. |
| 2013/0319496 | A1 | 12/2013 | Karpowich |
| 2014/0020743 | A1 | 1/2014 | Konno |
| 2014/0026953 | A1* | 1/2014 | Zhang .................... H01B 1/22 136/256 |
| 2014/0048116 | A1 | 2/2014 | Schulz et al. |
| 2014/0175340 | A1 | 6/2014 | Choi et al. |
| 2014/0178671 | A1 | 6/2014 | Dreezen et al. |
| 2014/0374669 | A1 | 12/2014 | Hardin et al. |
| 2015/0060742 | A1 | 3/2015 | Glicksman et al. |
| 2015/0083213 | A1 | 3/2015 | Hardin et al. |
| 2015/0243812 | A1 | 8/2015 | Hardin et al. |
| 2016/0225926 | A1 | 8/2016 | Schmitt et al. |

FOREIGN PATENT DOCUMENTS

| | | |
|---|---|---|
| WO | 2009032429 A1 | 3/2009 |
| WO | 2013/036510 | 3/2013 |
| WO | 2013090570 A1 | 6/2013 |
| WO | 2013158857 | 10/2013 |
| WO | 2014174984 A1 | 10/2014 |
| WO | 2016099562 A1 | 6/2016 |

OTHER PUBLICATIONS

M. Amirjan et al., Preparation of tungsten base composite powder by electroless nickel plating, Powder Metallurgy, 2010, pp. 218-222, vol. 53, No. 3, USA.

K.Y. Lin et al., Synthesis of Invay alloy powders by electroless plating, Material Science and Engineering A, 2006, pp. 226-231, vol. 416, USA.

N. Hedgecock et al., On the Structure and Electrical Properties of Electroless Ni—B Films, Journal of the Electrochemical Society, 1975, pp. 866-869, vol. 122, No. 7, USA.

X. Zhu et al., Coating different thickness nickel-boron nanolayersonto boron carbide particles, Surface Coatings & Technology, 2008, pp. 2927-2934, vol. 202, USA.

F. Sirotti et al., Nickel-based air-firable thick-film conductors, Journal of Materials Science, 1990, pp. 4688-4693, vol. 25, USA.

International Search Report for International application No. PCT/US14/43521.

Machine translation of DE102011104396.

PCT/US2014/071608 International Search Report and Written Opinion of the International Search Authority dated May 14, 2015.

A. Ebong, N. Chen, "Metallization of crystalline silicon solar cells: A review", High Capacity Optical Networks and Enabling Technologies (HONET), 2012 9th International Conference on Dec. 12-14, pp. 102-109. DOI: 10.1109/HONET.2012.6421444.

D. L. Meier, E. A. Good, A. Garcia, B. L. Bingham, S. Yamanaka, V. Chandrasekaran, C. Bucher, "Determining components of series resistance from measurements on a finished cell", Proc. 4th World Conf. PVSEC, vol. 2, pp. 1315-1318, 2006. DOI: 10.1109/WCPEC.2006.279656.

D. L. Meier, H. P. Davis, R. A. Garcia, J. A. Jessup, A. F. Carroll, "Self-doping contacts to silicon using silver coated with a dopant source." Proc. IEEE Photovoltaic Specialists Conf., pp. 69-74, 2000. DOI: 10.1109/PVSC.2000.915755.

WO2014174984_MachineTranslation.

Goodrich, A., et. al. "A wafer-based monocrystalline silicon photovoltaics road map: Utilizing known technology improvement opportunities for further reductions in manufacturing costs." Solar Energy Materials and Solar Cells 114 (Jul. 2013): 110-35. DOI: 10.1016/j.solmat.2013.01.030.

Halm, A., et. al., "The Zebra Cell Concept—Large Area n-Type Interdigitated Back Contact Solar Cells and One-Cell Modules Fabricated Using Standard Industrial Processing Equipment", Proc. the 27th EU Photovoltaic Specialists Conference, pp. 567-570, (2012). DOI: 10.4229/27thEUPVSEC2012-2AO.2.1.

International Search Report and Written Opinion for International application No. PCT/US16/48097 dated Dec. 28, 2016.

Kholostov, K., et. al. "Electroplated nickel/tim solder pads for rear metallization of solar cells." IEEE J. Photovolt. 6 (2) 2016, p. 404-411. DOI: 10.1109/JPHOTOV.2015.2506408.

* cited by examiner

CORE-SHELL NICKEL ALLOY COMPOSITE PARTICLE METALLIZATION LAYERS FOR SILICON SOLAR CELLS

STATEMENT OF GOVERNMENT SUPPORT

The invention described and claimed herein was made in part utilizing funds supplied by the National Science Foundation under SBIR Contract No. IIP-1315284. The Government has certain rights in this invention.

CROSS-REFERENCE TO RELATED APPLICATIONS

This application is related to U.S. Provisional Patent Application 61/837,575, filed Jun. 20, 2013, U.S. Provisional Patent Application 61/881,394, filed Sep. 23, 2013, U.S. Provisional Patent Application 61/986,020, filed Apr. 29, 2013, U.S. Provisional Patent Application 61/986,025, filed Apr. 29, 2013, and U.S. Provisional Patent Application 62/011,496, filed Jun. 12, 2013, all of which are incorporated by reference herein.

TECHNICAL FIELD

This invention relates to solar cells, and more specifically to solar cells that use metallization pastes and the co-firing process to form electrodes. Embodiments of the present disclosure relate to conductive metallization pastes and inks for silicon based solar cells.

BACKGROUND

Screen printable metallization pastes are used to make electrical contact to silicon photovoltaic (PV) cells and to connect PV cells together. The cells are connected in series by making electrical contact between the metallization layers and solder coated, Cu tabbing ribbons. Three primary paste formulations are used in silicon based PV cells: 1) rear side aluminum paste, 2) rear side silver tabbing paste, and 3) front side silver paste. FIG. 1 is a schematic drawing that shows an example of silver-based metallization paste 100. The paste 100 has silver particles 110, glass frit 120, and an organic binder 130 mixed with solvent. Examples of pure silver, rear tabbing pastes made by DuPont™ (Solamet® PV505) and by Heraeus (SOL230H) contain 45-66% conductive particles by weight and are designed to reduce silver loading and have a resulting thickness between 4 and 10 µm after screen printing, drying, and co-firing. In some examples, the silver particles are a mixture of silver flakes that are 1 to 3 µm in diameter and silver spheres with a distribution of sizes ranging in diameter from 100 nm to 5 µm. Examples of pure silver, front metallization pastes made by DuPont™ (Solamet® (PV17x) and Heraeus (SOL9235H) contain more than 90 wt % conductive particles. Such front metallization pastes contain spherical silver particles that range in size between 300 nm and 5 µm. Such pastes are formulated to print lines that have a high aspect ratio, compact densely to improve bulk conductivity, and make ohmic contact to the emitter layer of a silicon solar cell.

In the most widely commercialized Si solar cell architecture, aluminum paste is used on >90% of the back side to form an ohmic contact to p-type Si, creating a back-surface field to improve PV performance. Rear side silver tabbing paste occupies regions not coated with aluminum paste and is used to promote strong adhesion to Si as well as solderability to solder coated Cu tabbing ribbon, as soldering directly to the aluminum paste is challenging. Front side silver paste is formulated to penetrate through the anti-reflective coating to make ohmic contact to the front, n-type silicon. During silicon PV cell processing each paste layer is screen printed successively and dried at low temperatures (e.g., about 150° C.). Once the three layers are printed, the entire wafer is co-fired to over 750° C. for approximately one second in air to form ohmic contacts and promote paste adhesion to the silicon.

Silver based metallization pastes are inherently expensive because of the amount of Ag required and the commodity price of Ag, which is close to $625/kg in 2014. Silver based metallization pastes are the second largest materials cost for Si PV modules, and it is estimated that the PV industry currently uses more than 5% of all annual silver production. Continued, large increases in PV cell production will use more and more silver, which may become prohibitively expensive and unsustainable in the long-term.

BRIEF SUMMARY

A metallization paste is disclosed. The paste has a plurality of core-shell nickel particles. Each core-shell nickel particle has a nickel core and a first shell surrounding the core. The first shell may consist of a nanocrystalline nickel boron alloy with 1-8 wt % boron. The paste also has silver particles and glass frit. The core-shell nickel particles, the silver particles, and the glass frit are all mixed together in an organic vehicle.

In one arrangement, the core-shell nickel particles each further comprise a second shell encasing the first shell, the second shell made of a material different from the first shell, the second shell comprising one or more of silver (Ag), tin (Sn), zinc (Zn), lead (Pb), and nickel alloys.

In one arrangement, the paste has at least 20 wt % core-shell nickel particles. The paste may have at least 10 wt % silver particles. In various arrangements, the paste has 30 wt % core-shell Ni particles, 50 wt % silver particles, 4 wt % glass frit, and 16 wt % organic vehicle; 30 wt % core-shell Ni particles, 30 wt % silver particles, 4 wt % glass frit, and 36 wt % organic vehicle; 40 wt % core-shell Ni particles, 20 wt % silver particles, 2 wt % glass frit, and 38 wt % organic vehicle; or prises 30 wt % core-shell Ni particles, 30 wt % silver particles, 5 wt % glass frit, and 35 wt % organic vehicle.

In various arrangements, the ratio of silver to core-shell nickel particles is 1:9 by weight, 1:1 by weight, or 4:1 by weight.

In one embodiment of the invention, a metallization paste has a plurality of core-shell nickel particles, wherein each core-shell nickel particle has a nickel alloy core and a first shell surrounding the core. The first shell is made of a nickel alloy and is a material different from the core. The paste also includes silver particles and glass frit. The core-shell nickel particles, the silver particles, and the glass frit are all mixed together in an organic vehicle. The nickel alloy core may be pure nickel.

The first shell of the core-shell nickel particles may be a nickel alloy that contains between 50-100 wt % nickel and between 0 and 50 wt % of one or more of cobalt (Co), chromium (Cr), tin (Sn), zinc (Zn), lead (Pb), antimony (Sb), boron (B), and phosphorus (P).

The core-shell nickel particles may have a spherical shape and have a mean diameter between about 300 nm and 3 µm.

The core-shell nickel particles may have flake, dendrite, or filament shapes. The flake may have a diameter between 1 and 10 µm and a thickness between 100 nm and 500 nm. The filament may have a diameter between 200 µm and 1000 nm and a length greater than 1 µm.

BRIEF DESCRIPTION OF THE DRAWINGS

The foregoing aspects and others will be readily appreciated by the skilled artisan from the following description of illustrative embodiments when read in conjunction with the accompanying drawings.

DETAILED DESCRIPTION

Figure 1:
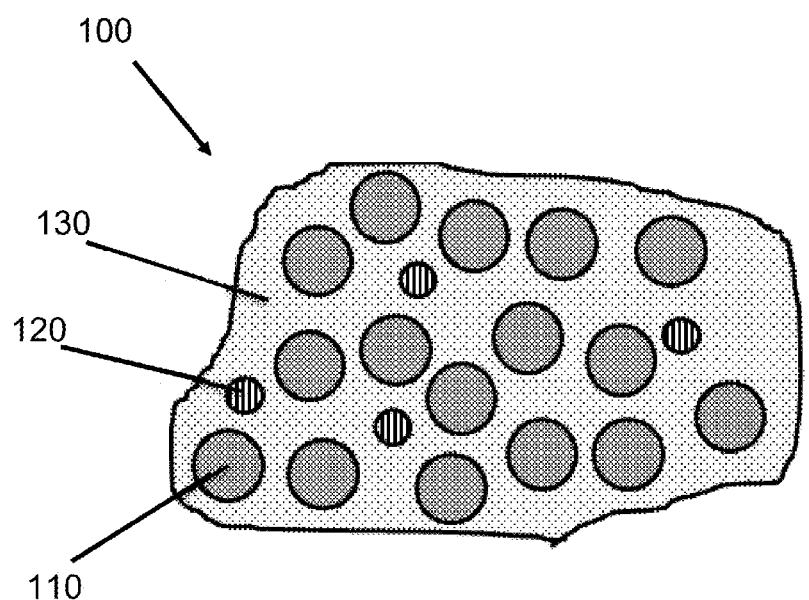
FIG. 1 is a schematic drawing of a silver metallization paste (prior art).

It will be appreciated that numerous specific details are set forth in order to provide a thorough understanding of the embodiments described herein. However, it will be understood by those of ordinary skill in the art that the embodiments described herein may be practiced without these specific details. In other instances, well-known methods, procedures and components have not been described in detail so as not to obscure the embodiments described herein. Furthermore, this description is not to be considered as limiting the scope of the embodiments described herein in any way, but rather as merely describing the implementation of the various embodiments described herein.

Metallization pastes are used to form three different layers on the solar cell: rear tabbing, fine grid lines, and front busbars. These layers have different materials properties that fall into four primary categories:
- solderability
- peel strength,
- resistivity of ohmic contact to silicon, and
- conductivity.

Solderability is the ability to form a strong physical bond between two metal surfaces by the flow of a molten metal solder between them at temperatures below 400° C. All soldering on a solar cell is performed after heating in air to over 750 C for approximately one second, and the term, "high-temperature solderability," is used herein to mean the ability to be soldered after heating to over 750 C in air. High-temperature solderability has a stricter standard than solderability and precludes the use of metals which form thick layers of oxide on heating to 750 C. High-temperature solderability involves the use of flux, which is any chemical agent that cleans or etches one or both of the surfaces prior to reflow of the molten solder. This becomes even more difficult because many metal oxides are resistant to commonly used fluxes after oxidation above 750 C.

For layers that directly contact a tabbing ribbon, it is useful if the peel strength is greater than 1 N/mm (Newton per millimeter). The peel strength is defined as the force required to peel a soldered ribbon, at a 180° angle from the soldering direction, divided by the width of the soldered ribbon. It is common for the peel strength to be between 2 and 4 N/mm on contacts to the tabbing ribbons in commercially available solar cells. Peel strength is a metric of solder joint strength for solar cells.

The conductivity of a solar cell is determined by directly measuring the resistance of individual layers on the solar cell. Meier et al. describes how to use a four-point probe electrical measurement to determine the resistivity of each metallization layer (Reference: Meier et al. "Determining components of series resistance from measurements on a finished cell", IEEE (2006) pp 1315). Because Ag based metallization layers are relatively compact (i.e., have low porosity) the bulk resistivity of the metallization layer is often considered a more useful metric than the actual resistivity of the metallization layers themselves. However, for some types of metallization pastes, the films do not completely compact. Thus the bulk resistivity may not provide an accurate comparison between different types of metallization pastes with the same printed thickness, and it is best to measure the resistance of individual layers in the method described by Meier et al. for an accurate comparison. When describing the difference in resistivity between nickel and silver based metallization layers we are implying the absolute lowest ratio whether comparing the bulk resistivity or the measured total resistivity of the individual layer as measured using the four-point probe method described by Meier et al. Ohmic contact resistivity is a measure of the contact resistivity between the fired metal film and the silicon surface. The contact resistivity can be measured by TLM (transfer length method) and is in the range of 1 to 100 $m\Omega\text{-}cm^2$.

Currently about 75% of all the silver used on a solar cell is in the silver paste on the front of the silicon substrate (the side exposed to sunlight) as fine grid lines and busbars; the remaining 25% is used on the back side as the rear tabbing layer. State-of-the-art front side metallization pastes contain silver, glass frit, binder, and a solvent. Some example pastes contain over 80 wt % pure silver particles. The paste mixtures are formulated to be printed directly onto solar cells via screen printing, subsequently dried, and then fired in an oxidizing ambient to vaporize and oxidize organic molecules in order to achieve higher electrical conductivity. In some examples, the front busbar and fine grid line layers are deposited during the same screen printing step.

The purpose of the fine grid lines is to collect current from the front side of the solar cell and transport it to the busbars. Thus it is important to use highly conductive materials (e.g., silver) for fine grid lines. This is especially important when using two or three busbar architectures, as the distance over which the current travels in the fine grid lines before reaching a busbar can be greater than one centimeter. Even when the fine grid lines are silver, approximately 75% of the total series resistance of a solar cell with a two busbar architecture comes from current flowing through the fine grid lines.

Upon firing the front side, the silver paste is designed to condense with a minimum amount of voids and to achieve a bulk resistivity that is 1.2-1.5 times the bulk resistivity of pure silver (1.5E-8 ohm-m). The front side silver paste is also designed to print with a high aspect ratio to form fine grid lines that are 20-60 µm wide and 20-50 µm high. Reducing the width of the grid lines can improve the light absorption of the PV cell by exposing more silicon to sunlight. Increasing the height of the fine grid lines can further reduce the series resistance. Fine grid lines also form ohmic contacts with silicon; it is useful if the ohmic contacts have a resistance less than about 100 mΩ-cm$^2$. It should be noted that the fine grid lines are not physically connected to the tabbing ribbon, so solderability and peel strength are not important metrics for fine grid lines.

The purpose of the busbars is quite different. The busbars make ohmic contact to both the fine grid lines and the tabbing ribbon. It is important that the front busbar layer is high-temperature solderable and adheres well to the front side of the solar cell. The front busbars transfers current from the fine grid lines to the copper tabbing ribbon to connect multiple solar cells in a module. Importantly, current transport occurs vertically through the thickness of a continuously tabbed busbar layer, which is 10-20 µm thick, and not laterally as in the case of the fine grid lines. Therefore, though it may be non-obvious, busbars can have a bulk conductivity that is less than 100 times that of silver without impacting solar cell performance significantly. It is useful if the front busbar layer has a peel strength greater than 1 N/mm after it is soldered to the tabbing ribbon.

In current PV cell architectures, the busbar and fine grid lines are printed at the same time using the same front side metallization paste. After both layers are dried, they are fired at the same conditions as described above, at which time they partially decompose the silicon nitride (anti-reflective) layer and make electrical contact to the underlying silicon. The busbars make ohmic contact to the silicon with a contact resistance less than 100 mΩ-cm$^2$.

In some cases floating busbars are desirable. A floating busbar is a busbar that does not make significant direct electrical contact to the silicon but only to the fine electrical grid lines on the front side of the silicon solar cell. This means that the contact resistivity between the fired floating metal busbar and the silicon surface exceeds 0.1 Ω-cm$^2$. For such busbars, metal pastes that do not fully penetrate through the anti-reflective coating after firing are formulated.

To date, attempts to reduce silver usage on the front side of silicon solar cells have involved completely redesigning the front contact deposition method and changing the process flow. One recently implemented method is the sequential electroplating of layers of nickel, copper, and silver to form a multilayer grid. This process requires laser scribing through the silicon nitride anti-reflective coating to expose the surface of the silicon emitter region followed by electroplating base metals to form fine grid lines and busbars. First a thin nickel layer is electroplated to promote adhesion to silicon. Then a thicker conductive copper layer is electroplated onto the nickel layer. Then the stack is capped with a thin silver layer for soldering to the copper tabbing ribbon. This approach requires new, non-standard, processing steps and equipment. In addition, such a stack may not be resilient against temperature fluctuations during regular use of the solar cell, which could lead to copper oxidation and copper diffusion into the silicon. Copper diffusion is especially problematic because it can cause local shunting through the emitter region. One other problem with this approach is that as nickel reacts with silicon a nickel silicide may form. The emitter region of the solar cell is thin (e.g., 50-500 nm), and there is a risk that the nickel silicide may consume the entire emitter layer and shunt the solar cell. These problems, in addition to capital expenditures and waste disposal requirements, have limited the adoption of electroplating processes in silicon solar cell manufacturing.

The purpose of the rear tabbing layer is to make ohmic contact to an Al layer on the back side of the silicon. The Al layer collects current from the rear side of the solar cell. It is useful if the rear tabbing layer is high-temperature solderable and adheres well to the silicon. The rear tabbing layer is soldered to the copper tabbing ribbon in order to transport current from the rear side of the solar cell to the tabbing ribbon. Importantly, current transport occurs vertically through the thickness of the rear tabbing layer, which is 4-10 µm thick, and not laterally as in the case of the fine grid lines, as discussed above. Therefore, though it may be non-obvious, rear tabbing layers can have a bulk conductivity that is less than 100 times that of silver without impacting solar cell performance significantly. In general, the rear tabbing layer does not make ohmic contact to the rear side of the solar cell. It is useful if the rear tabbing layer has a peel strength greater than 1 N/mm after it is soldered to the tabbing ribbon.

Nickel is both significantly cheaper and more abundant than silver; developing Ni based metallization pastes has the potential both to reduce PV module costs and to be in good supply to an ever-growing PV industry. Nickel is a low cost, base metal that, unfortunately, has a propensity to oxidize in oxygen rich conditions that are typical when processing silicon based PV cells. To date, pure nickel particles have been mixed into metallization pastes for solar cells at relatively small concentrations (e.g., 5-10% wt) because of their propensity to oxidize during co-firing which causes them to have reduced peel strength and lowered high-temperature solderability. It has not been possible to significantly increase the nickel loading in Ag based metallization pastes without compromising performance and reliability.

Silver coated nickel particles are commercially available and are used for lower temperature applications such as electromagnetic interference coatings, adhesives, gaskets, and sealants. Unfortunately, at high temperatures in air Ag is known to attack Ni galvanically which increases the Ni oxidation rate. Extremely thick Ag coatings would reduce this reaction at temperatures such as 750 C, but this would not substantially reduce the amount of silver in the metallization paste. Several researchers have also worked on copper and silver coated copper based metallization pastes, which have high conductivity. Unfortunately, Cu is a highly mobile impurity in Si and any Cu diffusing into the silicon can result in cell reliability and yield issues. It is extremely important that alternative metallization pastes do not reduce device performance, manufacturing yield, or reliability.

A nickel based metallization paste for use in front side fine gridlines, front side busbars, and rear side tabbing metallization layers of a silicon solar cell is disclosed in the embodiments of the invention. The purpose of the various embodiments is to act as a low cost drop-in replacements for screen printed, silver based contacts.

For the purposes of this disclosure, the term. "standard firing conditions," is used to mean heating to between 750 C and 900 C for about 0.5 to 3 seconds in ambient air conditions using an IR belt furnace or similar tool.

The term "mean particle diameter" of spherical particles is defined as the arithmetic average of particles' thinnest dimension. This measurement is typically performed with a laser particle size analyzer such as the Horiba LA-300. Particles are dispersed in a solvent in which they are well separated and the scattering of transmitted light correlates to the mean particle diameter.

In one embodiment of the invention, a nickel based metallization paste is provided. The paste has acore-shell nickel particles that can withstand standard PV cell firing conditions. The paste has strong adherence to silicon and have high temperature solderability. In this context, high-temperature solderability means that a metal surface can be soldered with techniques utilized by solar manufacturers after a PV cell has undergone standard firing conditions.

Figure 2:
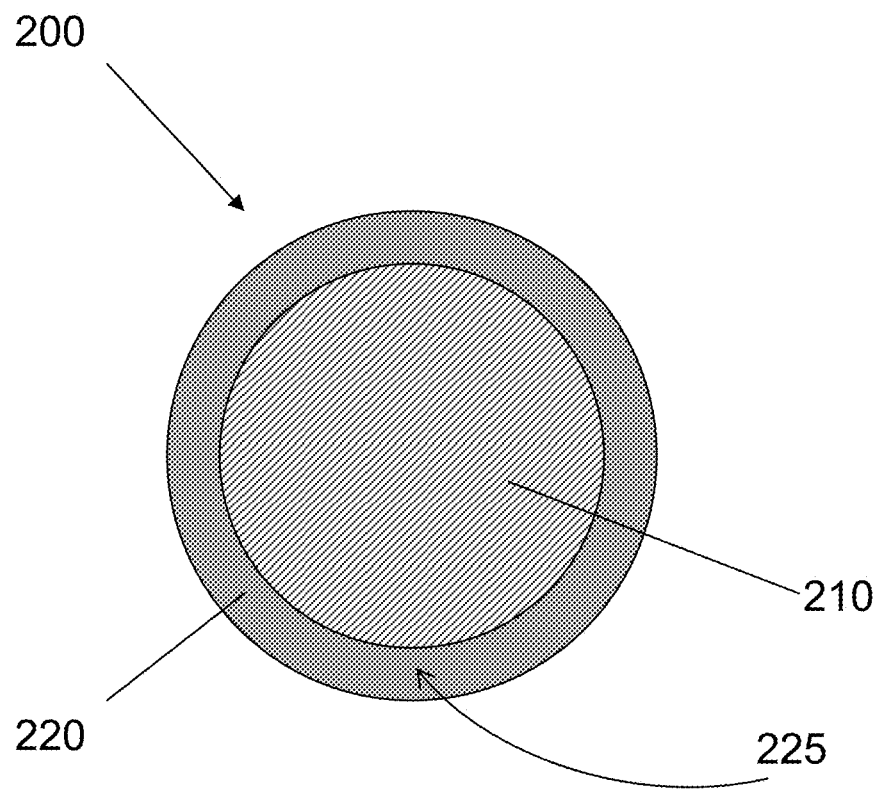
FIG. 2 is a schematic drawing of a metal particle that has one coating layer, according to an embodiment of the invention.

FIG. 2 is a schematic drawing of a core-shell or coated metal particle 200, according to an embodiment of the invention. There is a core particle 210 that is surrounded by a first shell 220. The outer surface 225 of the shell 220 is also indicated. The core particle 210 may be made of nickel or a nickel alloy. The first shell 220 may be made of tin (Sn), zinc (Zn), lead (Pb), nickel alloy, or a combination thereof, such that it has a different composition that the core. Nickel alloy is defined as a metal consisting of 50-100 wt % nickel and 0-50 wt % of one or more of the following elements: cobalt (Co), chromium (Cr), tin (Sn), zinc (Zn), lead (Pb), antimony (Sb), boron (B), phosphorus (P).

In one embodiment, this shell contains >5% Sn. In another embodiment, this shell contains >5% Zn. In another embodiment, this shell contains >5% Pb. The core particle 210 may have a mean particle diameter between about 0.01 and 50 μm, or between about 0.1 and 10 μm, or between about 0.3 and 3 μm. The first shell 220 may have a mean thickness between about 5 and 1000 nm, or between 5 and 300 nm, or between 5 and 100 nm.

In some embodiments, the particles are nominally spherical, but there can be variations in diameter in any one particular particle and between particles. In other embodiments, core-shell particles are not spherical. Possible particle shapes include, but are not limited to, dendrites, flakes, and filaments. Ni flakes may have diameters between about 1 and 3 μm and thicknesses between about 50 and 500 nm. Ni dendrites and filaments may have diameters ranging between about 100 and 1000 nm and lengths greater than about 1 μm. Dendritic and filamentary materials have higher interparticle connectivity per given mass, and may be especially useful for solar applications, where high mechanical strength and electrical conductivity are advantageous.

Figure 3:
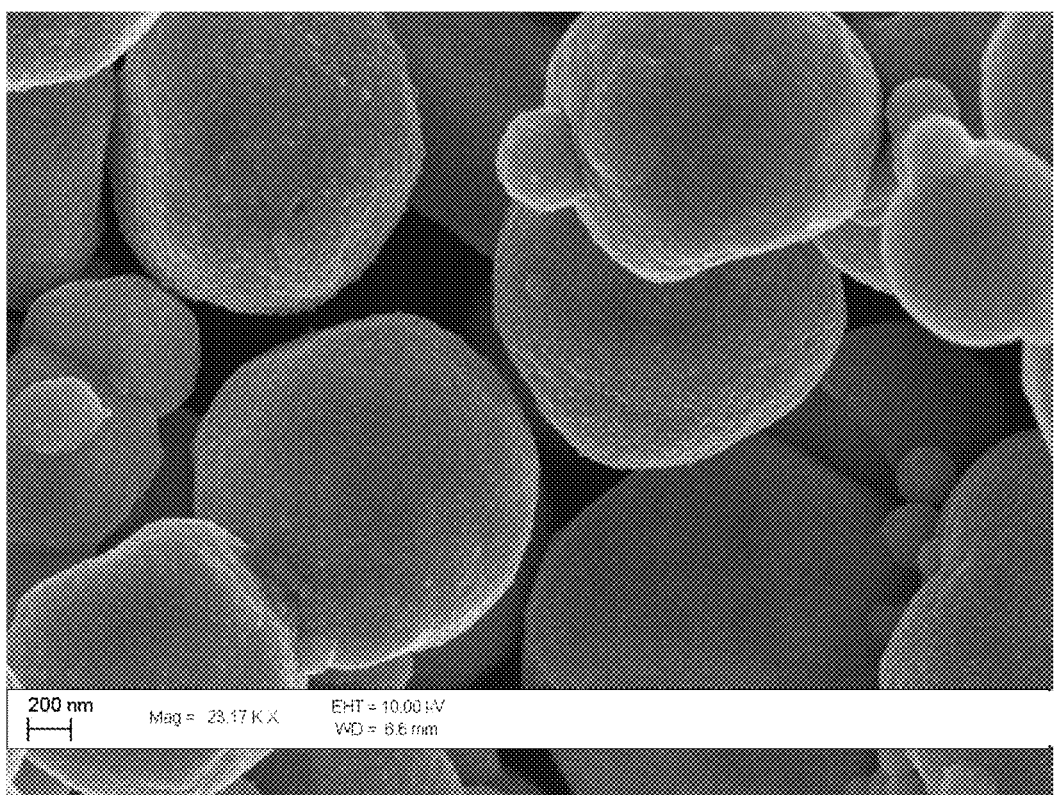
FIG. 3 is a scanning electron microscope image of core-shell particles in an embodiment of the invention.

In one embodiment of the invention, the first shell 220 contains between 1 and 8 wt % boron and between 92 and 99% nickel. The morphology is nanocrystalline with some amorphous regions as can be seen in SEM, Energy Dispersive X-Ray Spectroscopy, and Auger Electron Spectroscopy. Nanocrystalline microstructure is defined as the arrangement of crystalline material into domains or grains of less than 20 nm in their smallest dimension with grain boundaries found between individual grains. Nanocrystalline morphology is further defined to include the intimate mixture of crystalline and amorphous phase domains, both with a smallest dimension less than 20 nm. Without wishing to be bound to any particular theory, it may be that such a nanocrystalline morphology allows boron to be especially mobile within the first nickel:boron (Ni:B) shell The term, "Ni:B," is used herein to mean an metallic alloy (and not a Ni—B intermetallic compound) comprising 92-99 wt % Ni and 1-8 wt % B. These alloys have metallic character. FIG. 3 is a scanning electron microscope image of nickel particles coated in the nanocrystalline, Ni:B shell. The small grain sizes in nanocrystalline microstructures result in a large volume fraction of grain boundaries and enable fine intermixing of amorphous and crystalline domains. It is understood that nanocrystalline microstructures can be designed to have different properties than their bulk crystalline counterparts due to effects such as grain coarsening, low diffusion of oxygen, and selective diffusion along grain boundaries.

Upon heating, boron can diffuse to the outer surface 225 of the first shell and oxidize, preventing diffusion of oxygen through the shell and into the core particle. Such shells are particularly effective at preventing oxidation during rapid firing. It is possible to significantly reduce oxidation and provide high-temperature solderability by coating metal particles in nickel alloys with a nanocrystalline morphology. It should be noted that the concentration of boron in the nickel is important in determining both the morphology of the shell and the boron oxide phase(s) that form on the surface. For example, for lower boron concentrations, non-nanocrystalline morphologies with much larger grains result. For higher boron concentrations, some boron oxide phases are formed and are not easily dissolved in by common R and RMA fluxes, which can be detrimental to solderability.

The first shell 220 around the core particle 210 may be fabricated using electroless nickel or galvanic replacement. In one example, nickel boron (Ni:B) can be conformally coated onto pure nickel particles via electroless deposition in an aqueous solution. The term, "Ni:B," is used herein to mean an metallic alloy (and not a Ni—B intermetallic compound) comprising 92-99 wt % Ni and 1-8 wt % B. These alloys have metallic character. The second shell 530 may include one or more of the following: silver (Ag), tin (Sn), zinc (Zn), lead (Pb), and nickel alloys (different from the first shell). Electroless deposition is the deposition of metal or metallic alloys onto a surface by the reaction of a reducing agent (for example, potassium hypophosphite, sodium borohydride, dimethylamine borane complexes) on a metallic salt (for example, nickel chloride, nickel sulfate) in an aqueous medium. If a metal alloy coating is desired, a mixed solution of the metal salts is used (for example, nickel chloride and lead chloride for a nickel alloy) in conjunction with the reducing agent. Zhu et al. taught a method to coat $B_4C$ powders with a mean particle size of 2 um with about 5 nm of a Ni:B alloy. A person of ordinary skill in the art would know how to use appropriate reagent concentrations and reaction times to produce a desired shell thickness on particular metal particles in an analogous manner.

Figure 4:
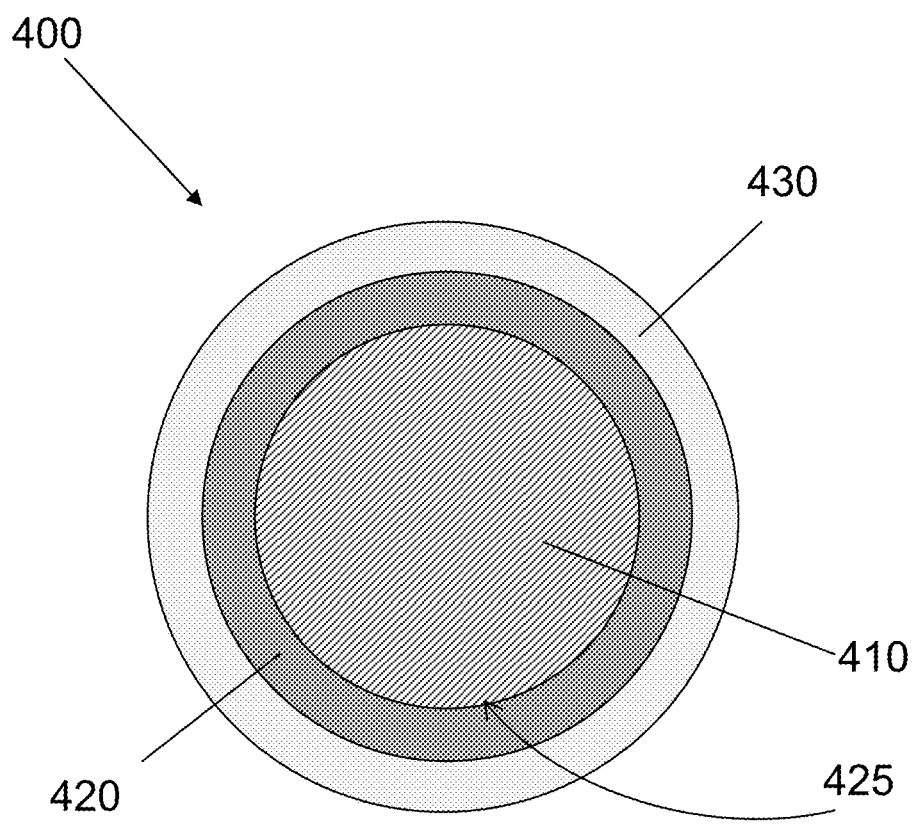
FIG. 4 is a schematic drawing of a metal particle that has two coating layers, according to an embodiment of the invention.

FIG. 4 is a schematic drawing of a metal particle 400 that has two coating layers, according to an embodiment of the invention. There is a core particle 410 that is surrounded by a first shell 420 and a second shell 430. The surface 425 of the core particle 410 is also indicated. The core particle 410 is made of nickel or nickel alloy. The first shell 420 may be made of tin (Sn), zinc (Zn), lead (Pb), nickel alloy, or a combination thereof, such that its composition is different than that of the core. In one example, the first shell 420 is nanocrystalline Ni:B. The term, "Ni:B," and "Nickel boron" are used herein to mean an metallic alloy (and not a Ni—B intermetallic compound) comprising 92-99 wt % Ni and 1-8 wt % B. These alloys have metallic character. The second shell 430 may include one or more of the following: silver (Ag), tin (Sn), zinc (Zn), lead (Pb), and nickel alloys (different from the first shell). The second shell 430 is composed of materials different from both the core and first shell. In one example, the second shell 430 is silver. The core particle 410 may have a mean particle diameter between about 0.01 and 50 μm, or between about 0.1 and 10 μm, or between about 0.3 and 3 μm. The first shell 420 may have a mean thickness between about 5 and 1000 nm, or between 5 and 300 nm, or between 5 and 100 nm. The second shell 530 may also have a mean thickness between about 5 and 1000 nm, or between 5 and 300 nm, or between 5 and 100 nm.

In some embodiments the core-shell nickel particles with only a first nanocrystalline Ni:B shell do not deform during firing in the presence of glass fits. It can be challenging for pastes made of core/shell (Ni/Ni:B) particles to be processed in a way that the particles maintain strong adhesion to one another or to silicon. Adding a second shell of Ag over the Ni:B can promote Ag surface diffusion around composite particles and can strengthen sintering among the composite particles.

As discussed above, Ag is known to attack Ni galvanically at high temperatures, increasing the Ni oxidation rate. This effect has been mitigated in the past by using extremely thick Ag coatings. However, Ni:B is not attacked galvanically by Ag ins some embodiments. Thus, it is possible in some embodiments to use only a very thin layer of Ag as the second shell 430 material. This important effect makes it possible to use only a very small amount of silver on the core particle and further reduce the overall Ag loading in a metallization paste.

In one embodiment, the second shell is silver, and the first shell acts as a barrier to corrosion between the nickel alloy core and the silver shell. In this embodiment, the first shell material is chosen to have an alloy composition which is highly passive to corrosion, such as nickel alloys comprising more than 1 wt % B, more than 1 wt % P, more than 1 wt % Sn, or more than 1 wt % Cr, or a combination thereof.

As a point of clarification, the shells may each be either metals or alloys, and the overall morphology of the core/shell particle is called a composite. After a metallization paste made up of such composite particles is fired, the resulting morphology is also called a composite.

Galvanic replacement is a technique which may be used to coat particles with a second shell of silver. In one example, a nickel core particles that are surrounded with Ni:B shells can be dispersed in an aqueous solution of silver salts (for example, silver nitrate or silver cyanide). After a sufficient time, the silver solution is removed, and the resulting particles will have replaced several nanometers of the surface Ni:B shells with silver shells. This reaction is driven by the potential difference between silver ion reduction and nickel metal oxidation and as such will occur spontaneously under most conditions.

It can be appreciated that more than two layers may be used to coat a Ni particle. Alternate solution-based or dry synthetic methods can be used to produce the same core-shell structure shown in FIG. 2 and FIG. 4, including but not limited to spray pyrolysis, sol-gel coating, and chemical vapor deposition.

In one arrangement, a metallization layer is made up mainly of core-shell nickel particles in a silver matrix in a condensed particle morphology. After applying a core-shell Ni particle based paste and then firing it under standard firing conditions the film condenses the constituent particles, which reduces porosity. In an example embodiment, the core-shell Ni particles do not melt or deform during firing, leaving two phases (e.g., Ag and Ni) intermixed inside the film. The annealing step sinters or condenses the particles, reducing the porosity of the metallization. The Ni alloy composite particles do not melt during firing.

Metallization Pastes Based on Core-Shell Particles

Figure 5:
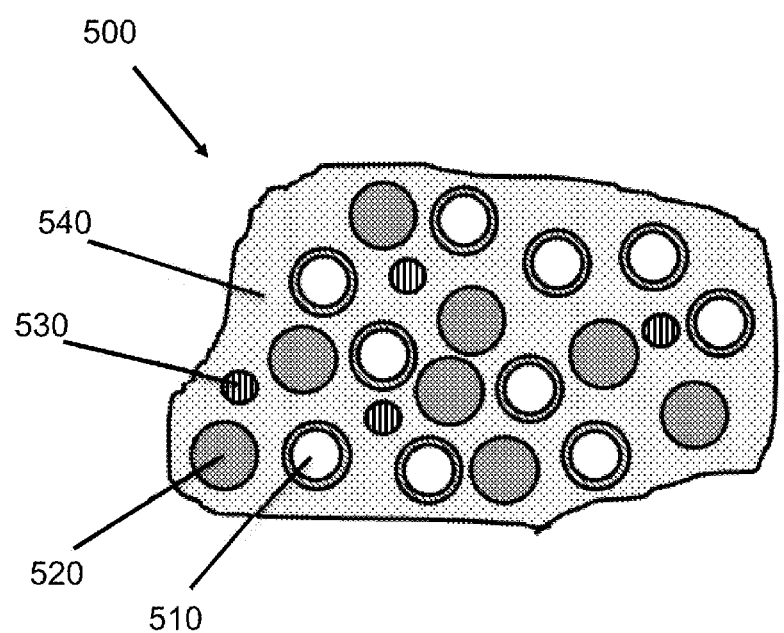
FIG. 5 is a schematic drawing that shows a metallization paste, according to another embodiment of the invention.

In contrast to FIG. 1, FIG. 5 is a schematic drawing of a nickel based metallization paste 500, according to an embodiment of the invention. The metallization paste 500 contains core-shell Ni particles 510, silver particles 520, glass frit 530, and organic vehicle 540. The core-shell Ni particles 510 may vary from 20% to 80% by weight in the paste. In yet another arrangement, the paste may have between about 30 wt % and 55 wt % core-shell Ni particles. In another arrangement, the paste may have between about 40 wt % and 50 wt % core-shell Ni particles. The total metal loading (i.e., both core-shell nickel particles and silver particles is between about 45 and 90% of the total paste weight. The ratio of silver particles 520 to core-shell nickel particles 510 can vary from 1:9 by weight (i.e., 10% Ag particles and 90% Ni based particles), to 5:1 by weight (i.e., 80% Ag particles and 20% Ni based particles) depending on the desired adhesion strength and high-temperature solderability. In another embodiment the ratio of silver particles 520 to core-shell nickel particles 510 can vary from 1:1 by weight (i.e., 50% Ag particles and 50% Ni based particles), The remaining non-silver portions of metallization pastes are made up of organic vehicle and glass frit. Commercially available glass frit (e.g., Ceradyne product #V2079) and other additives can be used in front side metallization pastes to penetrate through anti-reflective coatings, improve silver sintering, and make ohmic contact to doped silicon. Glass frit may be a mixture of the oxides of bismuth, zinc, lead, and silicon, with the final ratios and compositions varied to achieve a melting point between 500 and 800 C. The doping density of the emitter region in the silicon and the additives in the metallization pastes can be adjusted relative to one another to optimize electrical contact. The organic vehicle is a mixture of organic solvents and binders. Organic vehicle can be adjusted depending on the exact paste deposition conditions. The viscosity of metallization pastes can be tuned by adjusting the amounts of organic binders and solvents in organic vehicle and by including thixotropic additives, organic binders, and solvents. In this way, various pastes can be made to apply coatings that can range in fired thickness between about 4 and 15 μm (e.g., for rear tabbing layers) and between about 20-50 μm (e.g., for front busbar and fine grid lines). It should be noted that it is possible to make much thicker films by printing again and again over previously-printed lines. Common coating solvents include terpineol and the family of glycol ethers (diethylene glycol monobutyl ether, triethylene glycol monobutyl ether, and texanol). Common organic binders include ethyl cellulose, carboxymethyl cellulose, poly(vinyl alcohol), poly(vinyl butyral), and poly(vinyl pyrrolidinone). In one embodiment, the Ni based paste may have between about 2 wt % and 10 wt % glass frit 530. In another arrangement, the Ni based paste may have about 3 wt % and 6 wt % glass frit 530. The remainder of the tabbing paste is the organic vehicle 540.

According to some embodiments of the invention, metallization pastes for PV cells have the same basic components: core-shell Ni particles, silver particles, glass frit, organic vehicle. But the proportions of these components vary depending on cell architecture and where the paste is used in the cell. Example embodiments of individual components for various purposes are shown in Table I. These are example embodiments and not meant to restrict the range of metal particle, frit, and organic vehicle concentrations.

TABLE I

|  | Core-Shell Ni Particles | Silver Particles | Glass Frit | Organic Vehicle |
| --- | --- | --- | --- | --- |
| Fine grid lines | 30 wt % | 50 wt % | 4 wt % | 16 wt % |

TABLE I-continued

|  | Core-Shell Ni Particles | Silver Particles | Glass Frit | Organic Vehicle |
|---|---|---|---|---|
| Front busbars | 30 wt % | 30 wt % | 4 wt % | 36 wt % |
| Floating busbar | 40 wt % | 20 wt % | 2 wt % | 38 wt % |
| Rear tabbing | 30 wt % | 30 wt % | 5 wt % | 35 wt % |

Ni Based Fine Grid Line Paste

With reference to FIG. 5, in various embodiments, the fraction of core-shell nickel particles 510 in fine grid line pastes is between about 80 wt % and 20 wt %, between about 70 wt % and 30 wt %, between about 60 wt % and 40 wt %, or between about 60 wt % and 50 wt %. The total metal loading (i.e., both core-shell nickel particles and silver particles) is between 70 and 90% of the total paste weight for fine grid lines. In various embodiments, layers fabricated via screen printing and co-firing of nickel based fine grid metallization pastes have resistivities between 1.5 and 7 times greater than bulk silver (1.5 E-8 ohms-m) as measured by a four point probe using a Van der Pauw type method. The Ni base fine grid line paste is formulated to achieve printed thicknesses between about 30 and 80 μm, which result in fired film thickness between 20 and 50 μm. The ratio of silver particles 520 to core-shell nickel particles 510 can vary from 1:9 by weight (i.e., 10% silver particles and 90% core-shell nickel particles), to 4:1 by weight (i.e., 80 wt % Ag particles and 20 wt % Ni alloy based particles) depending on the desired conductivity and based on the number of busbars in a given architecture. It should be noted that Ni based pastes used for fine grid lines can also be used for the front busbars, directly replacing the Ag front side pastes described above.

In an exemplary embodiment, a Ni based fine grid line paste has the following composition: 30 wt % core-shell nickel particles that are composed of a 1 μm nickel core covered with a nanocrystalline Ni:B shell, 50 wt % Ag particles, 4 wt % glass frit, with the remaining weight consisting of organic vehicle. In another exemplary embodiment, a Ni based fine grid line paste has the following composition: 55 wt % core-shell nickel particles that are composed of a 1 μm nickel core covered with a nanocrystalline Ni:B first shell and a second shell that is 0.5 μm thick silver, 35 wt % conductive Ag particles, 4 wt % glass frit, with the remaining weight consisting of organic vehicle.

Ni based Front Busbar Paste

With reference to FIG. 5, in various embodiments, the fraction of core-shell nickel particles 510 in front busbar pastes is between about 80 wt % and 20 wt %, between about 70 wt % and 30 wt %, between about 60 wt % and 40 wt %, or between about 60 wt % and 50 wt %. The total metal loading (i.e., both core-shell nickel particles and silver particles) is between 50% and 90% of the total paste weight for fine grid lines. The ratio of silver particles 520 to core-shell nickel particles 510 can vary from 1:9 by weight (i.e., 10% silver particles and 90% core-shell nickel particles), to 4:1 by weight (i.e., 80 wt % Ag particles and 20 wt % Ni alloy based particles) depending on the desired conductivity peel strength. In various embodiments, layers fabricated via screen printing and co-firing of nickel based front busbar metallization pastes have resistivities between 2 and 10 times greater than bulk silver (1.5 E-8 ohms-m) as measured by a four point probe using a Van der Pauw type method. The Ni based front busbar paste is formulated to achieve printed thicknesses between about 8 and 25 μm, which result in fired film thickness between 4 and 15 μm.

In an exemplary embodiment, a Ni based front tabbing paste has the following composition: 30 wt % core-shell nickel particles that are composed of a 1 μm nickel core with a nanocrystalline Ni:B shell, 30 wt % conductive Ag particles, 4 wt % glass frit, with the remaining weight consisting of organic vehicle. In another example embodiment, a front busbar paste has the following composition: 40% by weight core-shell nickel particles that are composed of a 1 μm nickel core with a nanocrystalline Ni:B first shell and a second shell composed of silver, 20% by weight Ag particles, 4% glass frit, with the remaining weight consisting of organic vehicle. In another embodiment, low activity glass frits are used instead of standard glass fits in Ni based front busbar pastes to prevent ohmic contact between the bus bars and silicon substrate, as taught by Wale et al in U.S. Pat. No. 5,279,682, which is included by reference herein. The floating busbar pastes may contain less silver than traditional front side pastes.

Ni based Rear Tabbing Paste

With reference to FIG. 5, in various embodiments, the fraction of core-shell nickel particles 510 in rear tabbing pastes is between about 60 wt % and 20 wt %, between about 60 wt % and 30 wt %, between about 50 wt % and 30 wt %, or between about 50 wt % and 40 wt %. The total metal loading (i.e., both core-shell nickel particles and silver particles) is between 45% and 60% of the total paste weight for fine grid lines. The ratio of silver particles 520 to core-shell nickel particles 510 can vary from 1:9 by weight (i.e., 10% silver particles and 90% core-shell nickel particles), to 5:1 by weight (i.e., 80 wt % Ag particles and 20 wt % Ni alloy based particles) depending on the desired conductivity and based on the number of busbars in a given architecture. In various embodiments, layers fabricated via screen printing and co-firing of nickel based rear tabbing metallization pastes have resistivities between 2 and 10 times greater than bulk silver (1.5 E-8 ohms-m) as measured by a four point probe using a Van der Pauw type method. The Ni based rear tabbing paste is formulated achieve printed thicknesses between about 8 and 25 μm, which result in fired film thickness between 4 and 15 μm.

In an exemplary embodiment a Ni based rear tabbing paste has the following composition: 30% by weight core-shell Ni particles (1 μm nickel core covered with a nanocrystalline Ni:B shell), 30 wt % Ag particles, 5 wt % glass frit, with the remaining weight consisting of organic vehicle. In another exemplary embodiment, a Ni based rear tabbing paste the has the following composition: 50 wt % core-shell nickel particles (1 um nickel core covered with a nanocrystalline Ni:B first shell and a silver second shell), 10% by weight conductive Ag particles, 5 wt % glass frit, with the remaining weight consisting of organic vehicle. Using a multi-shell Ni particle architecture can improve Ag surface diffusion and sintering between Ni-based particles, allowing for lower overall weight loading of Ag.

Solar Cell Fabrication Using Ni Based Rear Tabbing Pastes

Figure 6:
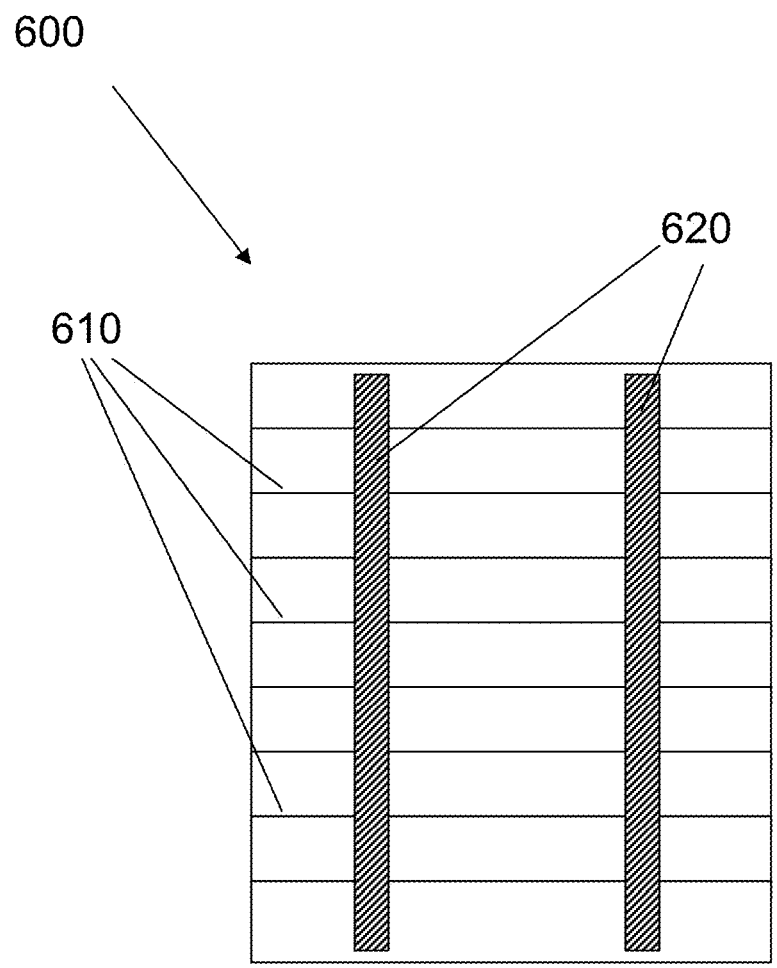
FIG. 6 is a schematic drawing that shows the front (or illuminated) side of a silicon solar cell.
Figure 7:
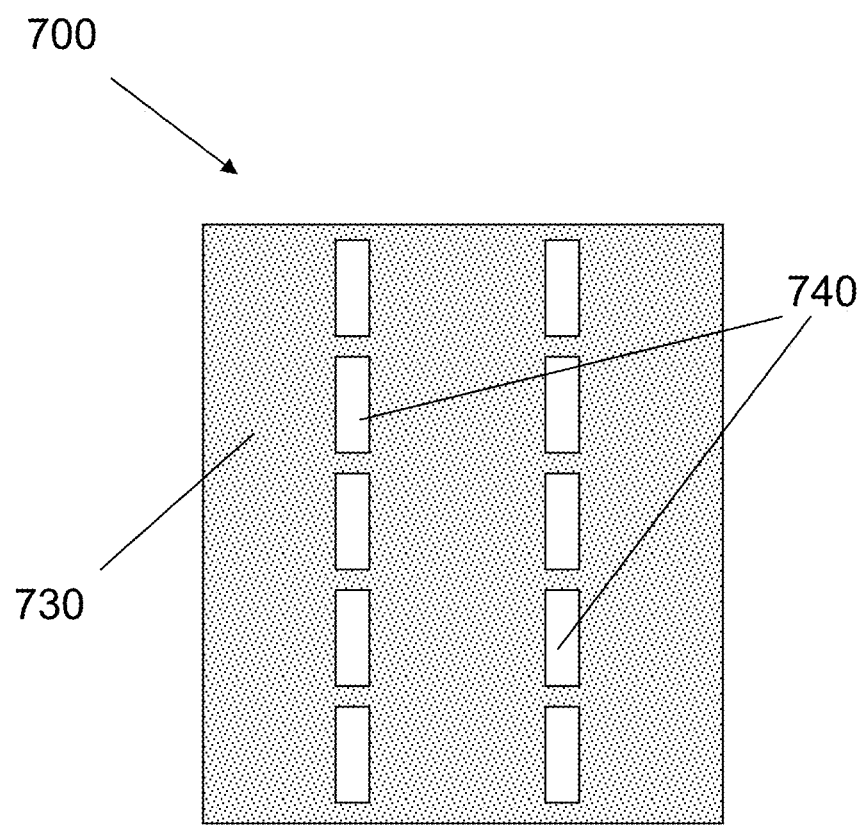
FIG. 7 is a schematic drawing that shows the rear side of a silicon solar cell.

For reference in the following discussion of metallization layers for solar cells, the following figures are included. FIG. 6 is a schematic drawing that shows the front (or illuminated) side of a silicon solar cell 600. The silicon solar cell 600 has a silicon wafer 610 with an anti-reflective coating (not shown) that has fine grid lines 620 and wide front side bus bars lines 630 FIG. 7 is a schematic drawing that shows the rear side of a silicon solar cell 700. The rear side is coated with an aluminum rear contact 730 and has rear side tabbing layers 740 distributed over the silicon wafer 710.

Metallization layers on solar cells are fabricated by first printing the front side silver paste followed by the silver rear tabbing paste and then the aluminum paste. Each paste is dried individually at 150 C for a couple of minutes and then co-fired at over 750 C for approximately one second.

In some embodiments silicon solar cells are connected to one another by soldering tin solder coated copper tabbing ribbons to the front busbars and rear tabbing layers. Solder fluxes that are commercially designated as either RMA (e.g. Kester® 186) or R (e.g. Kester® 952) are deposited on the front busbars and rear tabbing layers. A tinned copper ribbon, which is between 1.3 and 3 mm wide and 100-300 um thick is then placed on the solar cell and contacted to the front busbars and the rear tabbing layers with a solder iron at a temperature between 200 and 400 C. The solder joints formed during this process have a mean peel strength that is greater than 1 N/mm (e.g. a 2 mm tabbing ribbon would require a peel force of greater than 2N to dislodge the tabbing ribbon).

The nickel based rear tabbing paste can be used as a drop in replacement for commercial Ag based pastes to form the rear tabbing layer. In one embodiment, a commercially available front side metallization paste is screen printed and dried at 150° C. to form the fine grid line 610 and busbar 620 layers. A Ni based rear tabbing paste is then screen printed and dried at 150° C. to form the rear tabbing layer 720. The rear aluminum paste is subsequently printed and dried and the entire wafer is co-fired to over 750° C. for approximately one second in air.

The morphology of mixed silver and core-shell nickel metallization layers can be described in the absence of any process as a condensed particle morphology, which is defined as a sintered and compacted silver matrix that contains dispersed nickel, elements from the glass frit and/or reaction products from the glass frit and the Ni composite particle shells (e.g. boron) and silicon. Sintered and compacted silver films are defined as having tightly packed spherical or distorted spherical silver regions with less porosity than randomly packed hard spheres, and the contact areas between regions of silver are higher than in the case of tightly packed hard spheres. The morphology of some embodiments can also be described as a sintered and compacted silver matrix with dispersed core-shell nickel particles. In these cases, the core-shell nickel particles have easily discriminated core and shell layers. In further embodiments, the metallization layers comprising nickel and silver can also be described as a sintered and compacted silver matrix with dispersed nickel particles. In these cases, the discrimination between core and shell layers is lost during the standard firing due to diffusion and reaction.

Figure 8:
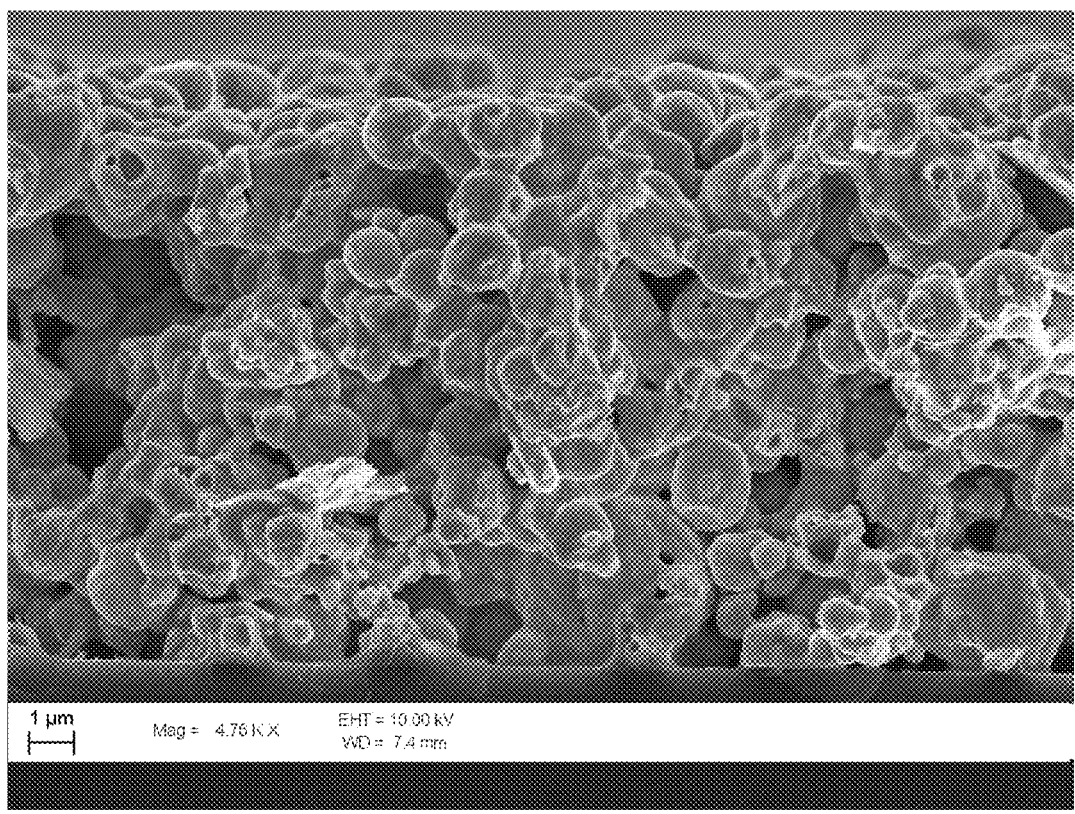
FIG. 8 is a scanning electron microscope image of the condensed particle morphology of Ni based layer in an embodiment of the invention.

Such material and phase compositions can be identified using x-ray diffraction, and individual elemental compositions can be determined through energy dispersive x-ray spectroscopy. Nickel and silver are not miscible in one another and do not form an alloy. FIG. 8 is a scanning electron microscope image of a condensed particle morphology consisting of core-shell Ni particles dispersed in a silver matrix. The resulting film morphology is a silver/nickel composite. The resulting rear tabbing layer can have a weight ratio of silver to nickel (Ag:Ni) of 1:9, or 1:1, or 4:1 depending on the desired conductivity and peel strength.

In several embodiments, the Ni based rear tabbing layer has a bulk conductivity that is 2 to 10 times less conductive than bulk silver, which has a bulk resistivity of about 1.5E-8 ohms-m. The rear tabbing layer is between 4-15 μm thick with a peel strength between 1 and 6 N/mm when soldered between 200 C and 400 C to a solder coated Cu-based tabbing ribbon using a Sn-based solder and a rosin containing, alcohol-based flux. The peel strength is determined by constantly pulling at 1 mm/sec at a 180° angle and measuring the resultant force necessary to remove the tabbing ribbon. In another embodiment, the resulting Ni based rear tabbing layer has a peel strength greater than 1 N/mm.

Solar Cell Fabrication Using Ni Based Front Busbar Pastes

The nickel based front busbar paste can be used as a drop in replacement for commercial Ag based pastes to form the front busbar layer. FIG. 6 is a schematic drawing that shows the front (or illuminated) side of a silicon solar cell, according to an embodiment of the invention. In one embodiment, a commercially available front side metallization paste is screen printed and dried at 150° C. to form the fine grid line 610. A Ni based front busbar paste is then screen printed and dried at 150° C. to form the front busbar layers 620. The rear tabbing paste and rear aluminum paste are subsequently printed and dried, as described above, and the entire wafer is co-fired to over 750° C. for approximately one second in air. In one arrangement, screen printed front busbar coatings range in thickness between about 4 and 15 μm after co-firing. The front busbar layer has a bulk conductivity that is 2 to 10 times less conductive than bulk silver, which has a bulk resistivity of about 1.5E-8 ohms-m. The resulting morphology of the front busbar layer is a condensed particle morphology as previously defined. The resulting front busbar layer can have a weight ratio of silver to nickel (Ag:Ni) of 1:9, or 1:1, or 5:1 depending on the desired conductivity and peel strength.

Figure 9:
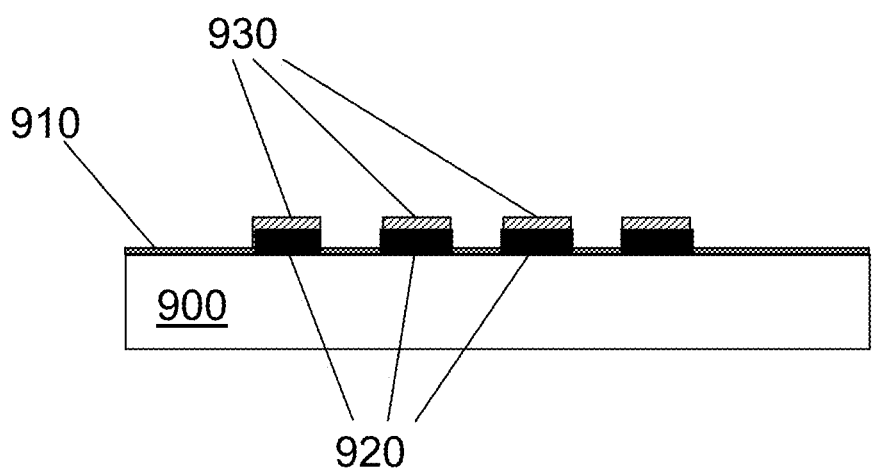
FIG. 9 is a schematic cross-section drawing that shows an embodiment of metallization layer on the front face of a solar cell.

FIG. 9 is a schematic cross-section drawing that shows metallizations on the front side of a solar cell, according to an embodiment of the invention. FIG. 9 shows solar cell 900 that is coated with an anti-reflective coating 910 on its front side. A silver paste is applied to the anti-reflective coating 910 to form fine grid lines 920 that fire through the antireflective coating. Such grid lines may have a thickness between about 10 μm and 50 μm. The fine grid layers 920 are seen in transverse cross section and run into and out of the page. A Ni based front busbar paste is then screen printed and dried at 150° C. to form second fine grid line layers 930 over the fine grid line layers 920 and additionally form front busbar layer (not shown). Thus, two layers make up stacked fine grid layers on the front side of the solar cell 910. The stacked fine grid layers have a Ag film 920 on the surface of the anti-reflective coating and a Ni alloy composite film 930 available for contacting a tabbing ribbon. The moderately conductive Ni layer 930 on the silver fine grid line 920 can further reduce the overall series resistance of the fine grid lines, as current travels in parallel between the layers. In an exemplary embodiment, a stacked fine grid layer that has a 20 μm thick Ag layer with a bulk resistance that is that of pure Ag and a 20 μm thick Ni composite layer with a bulk resistance that is 2 times that of pure Ag has an overall resistance that is 67% lower than the resistance for the single Ag layer alone.

Figure 10:
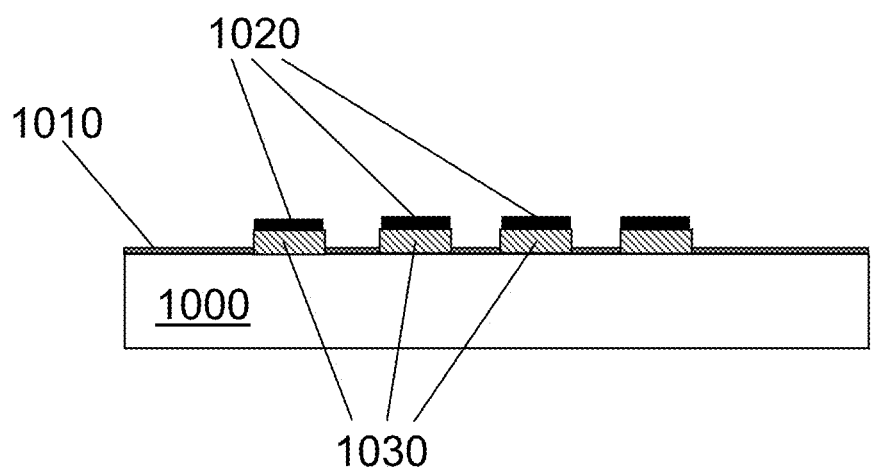
FIG. 10 is a schematic cross-section drawing that shows another embodiment of metallization layers on the front face of a solar cell.

FIG. 10 is a schematic cross-sectional drawing that shows metallizations layer and wafer on the front side of a solar cell 1000, according to another embodiment of the invention, in which the order of deposition is reversed. A Ni based front busbar paste is screen printed onto the solar cell 1000 and then dried at 150° C. to form front busbar layers (not shown) and to form a first fine grid line layer 1030 for a stacked fine grid line structure. Subsequently, a silver paste is applied over the fine grid line layer 1030 to form a second layer 1020. Thus, the resulting stacked fine grid line layer has a Ni composite film on the surface of the solar cell 1000 and a silver film available for contacting a tabbing ribbon. Again, the moderately conductive Ni layer 1030 reduces the overall series resistance of the fine grid lines as current travels in parallel between the layers.

Other PV Cell Architectures

Nickel alloy based pastes can be used in other, more complex, Si PV architectures, such as emitter wrap through and selective emitter cell architectures. Other examples include architectures where only fine grid lines are printed with no busbars and those that use fine wire network technologies to connect cells in a module. The metallization pastes described above may also be used in metal wrap through as well as passivated emitter rear contact (PERC) solar cells. The nickel alloy based paste, described herein, can be used as a drop in replacement for Ag based pastes anywhere that Ag pastes are used currently.

Fine grid lines on solar cells are responsible for making good electrical contact to the silicon emitter layer and transporting current from the emitter over a distance of centimeters to the busbar of the solar cell. Two important materials properties affect fine grid line design on solar cells: the bulk resistivity and the contact resistance between the fine grid line and the emitter layer. When the fine grid lines are highly conductive (e.g. within a factor of two of bulk Ag, which is the most conductive element) then the grid lines can be made thinner to reduce shading losses. Frits and other additives can be used in metallization pastes to fire through the anti-reflective coating and make ohmic contact to doped silicon. The additives in the metallization pastes determine the minimum required doping density of the emitter to make good electrical contact. The doping density of the emitter also affects the optimal grid spacing on a silicon solar cell.

For the currently standard two- and three-busbar silicon solar cells, the total series resistance of the solar cell may be dominated by series resistance of individual fine grid lines. As an example, for a two-busbar cell, 15% multi-crystalline PV cell, the series resistance from the fine grid lines represents 73% of the total series resistance (D. L. Meier "Determining components of series resistance from measurements on a finished cell", IEEE (2006) p 1315). Fine grid layers have been made up of pure Ag particles and have a bulk conductivity that is 1.1 to 2 times less conductive than bulk silver, which has a bulk resistivity of about 1.5E-8 ohms-m. The series resistance of fine grid lines is proportional to the spacing between busbars (a), the bulk resistivity ($p_f$), fine grid line thickness (t), and fine grid line width (w) as shown in equation (1). It should be noted that increasing the number of busbars by a factor of two reduces the fine grid line series resistance by a factor of four.

$$r_s(\text{fine grid lines}) \sim \frac{2}{3} a^2 \frac{p_f}{tw} \quad (1)$$

$$a = \frac{\text{Cell Width}}{2 * \text{busbar}(\#)}$$

$p_f$=fine grid line bulk resistivity
t=fine grid line thickness
w=fine grid line width The table below highlights the effect of the number of busbars versus the series resistance of the fine grid lines. For a large number of busbars (e.g., >4) the series resistance drops significantly. When a six inch solar cell has four or more busbars, the spacing between the busbars is less than 4 cm or less than 2 cm.

| Fraction of Total Resistance for two busbar cell % | Series Resistance Ohm | Busbar Number # | Cell Length (cm) | a (cm) | Areal Resistance R/cm^2 |
|---|---|---|---|---|---|
| 73% | 0.7594 | 2 | 15 | 3.75 | 0.054 |
| 33% | 0.3375 | 3 | 15 | 2.50 | 0.054 |
| 18% | 0.1898 | 4 | 15 | 1.88 | 0.054 |
| 12% | 0.1215 | 5 | 15 | 1.50 | 0.054 |
| 8% | 0.0844 | 6 | 15 | 1.25 | 0.054 |
| 6% | 0.0620 | 7 | 15 | 1.07 | 0.054 |
| 5% | 0.0475 | 8 | 15 | 0.94 | 0.054 |
| 4% | 0.0375 | 9 | 15 | 0.83 | 0.054 |
| 3% | 0.0304 | 10 | 15 | 0.75 | 0.054 |
| 2% | 0.0251 | 11 | 15 | 0.68 | 0.054 |
| 2% | 0.0211 | 12 | 15 | 0.63 | 0.054 |
| 2% | 0.0180 | 13 | 15 | 0.58 | 0.054 |
| 1% | 0.0155 | 14 | 15 | 0.54 | 0.054 |
| 1% | 0.0135 | 15 | 15 | 0.50 | 0.054 |
| 1% | 0.0119 | 16 | 15 | 0.47 | 0.054 |
| 1% | 0.0105 | 17 | 15 | 0.44 | 0.054 |
| 1% | 0.0094 | 18 | 15 | 0.42 | 0.054 |
| 1% | 0.0084 | 19 | 15 | 0.39 | 0.054 |
| 1% | 0.0076 | 20 | 15 | 0.38 | 0.054 |

By adding additional busbars to a solar cell, the current per tabbing ribbon can be reduced, thus reducing the overall power loss in the module. By increasing the busbar density on the solar cell, the average distance that current must travel along the fine grid lines can be drastically reduced, which can lower the overall series resistance of the cell. This also allows for using metallization layers for fine grid lines that are less conductive than silver. If fine grid lines with a slightly higher bulk resistivity than silver are used, it may be possible to offset those losses by adding a higher density of busbars.

Solar Cell Fabrication Using Ni Based Fine Grid Line

In one embodiment, a Ni based paste is screen printed and dried at 150 C to form the fine grid lines and front busbar layers. The rear Ag paste and rear aluminum paste layers are subsequently printed and dried, and the entire wafer is fired to over 750° C. for approximately one second in air to form ohmic contacts and promote adhesion. The resulting morphology of the fine grid line layer is a condensed particle morphology that comprises a silver phase that can contain elements from the glass frit and some elements from the shell (e.g. boron) and a pure nickel phase. These phases can be measured using x-ray diffraction and the individual elemental compositions can be seen using energy dispersive x-ray spectroscopy. The resulting fine grid line layers can have a weight ratio of silver to nickel (Ag:Ni) of 1:9, or 1:1, or 4:1 depending on the desired conductivity and peel strength.

In one arrangement, screen printed coatings range in thickness between about 20 and 50 µm and are dried at 150° C. It should be noted that it is possible to make thicker films by using successive printing steps. The resulting fine grid line layers have a conductivity that is 1.5 to 7 times lower than the bulk resistivity of pure silver.

The main components of metallization pastes have been described above. The ratio of silver particles to core-shell nickel particles can vary from 1:9 by weight (i.e., 10 wt % Ag particles to 90 wt % core-shell Ni particles), to 4:1 by weight (i.e. 80 wt % Ag particles versus 20 wt % Ni alloy based particles) depending on the desired conductivity for various applications. In various embodiments, the fraction of core-shell nickel particles is between about 80 wt % and 20 wt %, between about 70 wt % 30 wt %, or between about 60 wt % and 40 wt %. In various embodiments, the weight ratio of silver particles to core-shell nickel particles is between about 1:9 and 4:1, about 1:5 and 4:1, between about 3:7 and 7:3, between about 2:3 and 3:2, or about 1:1. When screen printed, dried at 150° C. for approximately three minutes, and rapidly fired in air to more than 750° C., these pastes form a condensed particle network on the substrate, that is, their volumes are reduced by one or more processes during firing, such as, evaporation of carrier, sintering, etc. In some embodiments, film thicknesses are between about 4 and 50 µm with a bulk resistivity that is 1.5 to 10 times higher than that of pure Ag using a four point Van der Pauw measurement on insulating substrates. The bulk resistivity is dependent upon the Ni:Ag weight ratio and the choice of glass frits. In another arrangement, the films have a bulk resistivity that is 1.5 to 7 times greater than the bulk resistivity of silver, which is 1.5E-8 ohms-m. In another arrangement, the films have a bulk resistivity between about 2 E-8 and 10 E-8 ohms-m.

In another embodiment, the same paste composition is printed for both front side layers simultaneously and would technically be considered a front side paste. There are also many different combinations of Ni and Ag based pastes that can be deposited onto silicon solar cells. One example, is to use Ni based pastes to form both front busbar and rear tabbing electrodes while the fine grid lines are made with Ag pastes. Many different architectures can be fabricated using the three types of Ni based metallization pastes described above.

This invention has been described herein in considerable detail to provide those skilled in the art with information relevant to apply the principles and to construct and use such specialized components as are required. However, it is to be understood that the invention can be carried out by different equipment, materials and devices, and that various modifications, both as to the equipment and operating procedures, can be accomplished without departing from the scope of the invention itself.

We claim:

1. A metallization paste comprising:
   a plurality of core-shell nickel particles, wherein each core-shell nickel particle comprises:
   a nickel core; and
   a first shell surrounding the core, the first shell consisting of a nanocrystalline nickel boron alloy with 1-8 wt % boron;
   silver particles; and
   glass frit;
   wherein the core-shell nickel particles, the silver particles, and the glass frit are all mixed together in an organic vehicle.

2. The metallization paste of claim 1 wherein the core-shell nickel particles each further comprise a second shell encasing the first shell, the second shell made of a material different from the first shell, the second shell comprising one or more materials selected from the group consisting of silver (Ag), tin (Sn), zinc (Zn), lead (Pb), and nickel alloys.

3. The metallization paste of claim 1, wherein the paste comprises at least 20 wt % core-shell nickel particles.

4. The metallization paste of claim 1, wherein paste comprises at least 10 wt % silver particles.

5. The metallization paste of claim 1, wherein the metallization paste comprises 30 wt % core-shell Ni particles, 50 wt % silver particles, 4 wt % glass frit, and 16 wt % organic vehicle.

6. The metallization paste of claim 1, wherein the metallization paste comprises 30 wt % core-shell Ni particles, 30 wt % silver particles, 4 wt % glass frit, and 36 wt % organic vehicle.

7. The metallization paste of claim 1, wherein the metallization paste comprises 40 wt % core-shell Ni particles, 20 wt % silver particles, 2 wt % glass frit, and 38 wt % organic vehicle.

8. The metallization paste of claim 1, wherein the metallization paste comprises 30 wt % core-shell Ni particles, 30 wt % silver particles, 5 wt % glass frit, and 35 wt % organic vehicle.

9. The metallization paste of claim 1, wherein the ratio of silver to core-shell nickel particles is 1:9 by weight.

10. The metallization paste of claim 1, wherein the ratio of silver to core-shell nickel particles is 1:1 by weight.

11. The metallization paste of claim 1, wherein the ratio of silver to core-shell nickel particles is 4:1 by weight.

12. A core-shell particle consisting of:
    a core comprising nickel; and
    a first shell surrounding the core, the first shell consisting of a conformal nickel boron alloy coating, wherein the nickel boron alloy contains 1-8 wt % boron.

13. The particle of claim 12, wherein the core-shell nickel particle has a spherical shape.

14. The particle of claim 12, wherein the core-shell nickel particle has a mean diameter between about 300 nm and 3 µm.

15. The particle of claim 12, wherein the particle has a shape selected from the group consisting of flake, dendrite, and filament.

16. The particle of claim 12, wherein the first shell has a thickness between 0.005 µm and 1 µm.

17. The particle of claim 12, wherein the first shell has a thickness between 0.005 µm and 0.3 µm.

18. The particle of claim 12, wherein the first shell has a thickness between 0.005 µm and 0.1 µm.

19. The particle of claim 12, further comprising a second shell surrounding the first shell, the second shell made of a material different from both the first shell and the core, the second shell comprising one or more materials selected from the group consisting of silver (Ag), tin (Sn), zinc (Zn), lead (Pb), and nickel alloy, and combinations thereof.

20. The particle of claim 19, wherein the second shell has a thickness between about 0.005 µm and 1 µm.

21. The particle of claim 19, wherein the second shell has a thickness between about 0.005 µm and 0.1 µm.

22. The particle of claim 19, wherein the core/shell particle is a flake, and the flake has a diameter between 1 and 10 µm and a thickness between 100 nm and 500 nm.

23. The particle of claim 19, wherein the core/shell particle is a filament, and the filament has a diameter between 200 µm and 1000 nm and a length greater than 1 µm.

24. A core-shell particle comprising:
    a core comprising nickel; and
    a first shell surrounding the core, the first shell consisting of a conformal nickel boron alloy coating, wherein the nickel boron alloy contains 1-8 wt %;
    wherein the particle has a shape selected from the group consisting of flake, dendrite, and filament.

25. The particle of claim 24, wherein the first shell has a thickness between 0.005 µm and 1 µm.

26. The particle of claim 24, further comprising a second shell surrounding the first shell, the second shell made of a material different from both the first shell and the core, the second shell comprising one or more materials selected from the group consisting of silver (Ag), tin (Sn), zinc (Zn), lead (Pb), and nickel alloy, and combinations thereof.

27. The particle of claim 26, wherein the second shell has a thickness between about 0.005 µm and 1 µm.

28. The particle of claim 24, wherein the core/shell particle is a flake, and the flake has a diameter between 1 and 10 μm and a thickness between 100 nm and 500 nm.

29. The particle of claim 5, wherein the core/shell particle is a filament, and the filament has a diameter between 200 μm and 1000 nm and a length greater than 1 μm.

* * * * *